(12) United States Patent
Shindo

(10) Patent No.: US 11,538,775 B2
(45) Date of Patent: Dec. 27, 2022

(54) SEMICONDUCTOR DEVICE AND METHOD OF MANUFACTURING A SEMICONDUCTOR DEVICE

(71) Applicant: LAPIS SEMICONDUCTOR CO., LTD., Kanagawa (JP)

(72) Inventor: Masanori Shindo, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 17/163,609

(22) Filed: Feb. 1, 2021

(65) Prior Publication Data

US 2021/0242145 A1 Aug. 5, 2021

(30) Foreign Application Priority Data

Feb. 4, 2020 (JP) .............................. JP2020-017209

(51) Int. Cl.
*H01L 23/00* (2006.01)
(52) U.S. Cl.
CPC .............. *H01L 24/02* (2013.01); *H01L 24/05* (2013.01); *H01L 24/13* (2013.01); *H01L 2224/02311* (2013.01); *H01L 2224/02373* (2013.01); *H01L 2224/05008* (2013.01); *H01L 2224/13024* (2013.01)

(58) Field of Classification Search
CPC ....................................................... H01L 23/498
See application file for complete search history.

(56) References Cited

U.S. PATENT DOCUMENTS

2010/0187677 A1\* 7/2010 Lee .................. H01L 24/11
257/E23.068

FOREIGN PATENT DOCUMENTS

JP 2000183214 A 6/2000

\* cited by examiner

*Primary Examiner* — William A Harriston

(74) *Attorney, Agent, or Firm* — Volentine, Whitt & Francos, PLLC

(57) ABSTRACT

A semiconductor device includes wiring that is formed by a conductive body extending, via an insulating film, on a front surface of a semiconductor substrate, and an insulating layer that covers the front surface of the semiconductor substrate including the wiring. Gaps are provided extending from an upper surface of the wiring to a lower portion of the insulating film.

19 Claims, 5 Drawing Sheets

Prior Art

SEMICONDUCTOR DEVICE AND METHOD OF MANUFACTURING A SEMICONDUCTOR DEVICE

CROSS-REFERENCE TO RELATED APPLICATION

This application is based on and claims priority under 35 USC 119 from Japanese Patent Application No. 2020-017209 filed on Feb. 4, 2020, the disclosure of which is incorporated by reference herein.

BACKGROUND

Technical Field

The present disclosure relates to a semiconductor device and to a method of manufacturing the semiconductor device.

Related Art

Conventionally, for example, Japanese Patent Application Publication Laid-Open (JP-A) NO. 2000-183214 is known as a publication concerned with the problem of stress generated in wiring. JP-A No. 2000-183214 describes how, in a chip-size package (hereinafter, referred to as a CSP), in an environment of a temperature cycle test or the like when the CSP is being packaged, the Cu wiring becomes synergistic with the metal posts and sizable stress is applied to the LSI transistor directly underneath this Cu wiring. This gives rise to the concern that the transistor characteristics may deteriorate. In addition, the chip-size package according to 2000-183214 is characterized in that, in a chip-size package equipped with a wiring layer that is connected to a metal electrode pad and is formed by Cu that is laid along the chip surface, an insulation layer that covers the chip surface including this wiring layer, an aperture portion that is formed in the insulation layer on top of the wiring layer, and a post-shaped terminal that is formed in the aperture portion, a plurality of slits are provided in the wiring layer.

FIG. 5 shows a structure of one of the aforementioned post-shaped terminals that are generally used in a CSP according to the conventional technology, as well as the periphery thereof. As is shown in FIG. 5, in a CSP according to the conventional technology, there is provided a circuit element area 11 that is formed on a semiconductor substrate (not shown in the drawings), a pad 15 that is formed on the circuit element area 11, a passivation film 19, an insulating film 12 that is formed on the passivation film 19, wiring 13 that serves as rewiring and that is formed on the insulating film 12, and mold resin 14 that is formed on the wiring 13. The wiring 13 is formed using a conductor such as, for example, copper (Cu) or the like. An aperture is provided in the passivation film 19 in the location of the pad 15, and the pad 15 is exposed through this aperture.

One end of the wiring 13 is connected to the pad 15, and the wiring 13 is formed so as to extend in a predetermined direction. A post-shaped body 20 that corresponds to the above-described post-shaped terminal is formed at another end of the wiring 13. This post-shaped body 20 is formed so as to include a terminal 17 and a solder bump 21. The post-shaped body 20 is open to the device exterior, and may be mounted, for example, on a printed circuit board via the solder bump 21. In other words, the wiring 13 forms a relay between the pad 15, which is connected to the circuit element area 11 via wiring that is not shown in the drawing, and the post-shaped body 20, and the circuit element area 11 is connected to the device exterior via this relay.

A temperature cycle test is performed as a general reliability test for semiconductor devices, and is not limited to CSP. A temperature cycle test is a test in which a printed circuit board on which a CSP or the like has been mounted is placed in a constant temperature bath, and is exposed to an environment temperature in a range of between, for example, −40° C. to +85° C. Subsequently, a characteristic test is performed thereon, and whether or not any defects are present is confirmed. Conventionally, when a temperature cycle test is performed on a printed circuit board on which a CSP has been mounted, there have been cases in which electrical characteristic defects have been generated. This is because, in a laminated body created by forming the passivation layer 19, the insulating film 12, the wiring 13, and the mold resin 14 and the like on the circuit element area 11, thermal stress caused by differences between the coefficients of thermal expansion of each of these is generated. This thermal stress extends as far as the circuit element area 11, and causes variations in the characteristics of the circuit elements formed in the circuit element area 11.

Thermal stress such as this tends to be generated most easily particularly in an area indicated by an X in FIG. 5, in other word, in an area extending from the pad 15 to the terminal 17. Accordingly, in the conventional technology, characteristic defects have been inhibited from occurring, for example, using measures such as not providing the circuit element area 11 in portions underneath the wiring 13 which is serving as rewiring. However, wiring rules such as this are not sufficient countermeasures, and there have been cases in which characteristic variations have still occurred in spite of these countermeasures having been taken. Furthermore, wiring rules such as this impose serious layout limitations when designing a CSP, and particularly in the case of current CSP which have an increasingly higher degree of integration, a basic solution to the above-described problem of thermal stress is still desired.

SUMMARY

In consideration of the above-described circumstances, an exemplary embodiment of the present disclosure is related to providing, in a semiconductor device having a wiring layer formed on circuit elements, a semiconductor device and a method of manufacturing a semiconductor device in which failures caused by thermal stress generation are inhibited.

In order to solve the above-described problems, a semiconductor device according to an exemplary embodiment of the present disclosure includes wiring that is formed by a conductive body extending, via an insulating film, on a front surface of a semiconductor substrate, and an insulating layer that covers the front surface of the semiconductor substrate including the wiring, wherein gaps are provided extending from an upper surface of the wiring to a lower portion of the insulating film.

In order to solve the above-described problems, a method of manufacturing a semiconductor device according to an exemplary embodiment of the present disclosure includes forming, on one surface of a semiconductor substrate, circuit elements that include first wiring, the circuit elements being connected by the first wiring to a pad, forming an insulating film on an upper portion of the circuit elements, and also forming apertures at the insulating film in an area of the pad and in a predetermined areas, and forming, on an upper portion of the insulating film, second wiring that is connected to the pad, and also forming the second wiring such that apertures are formed therein at the predetermined areas.

According to the exemplary embodiments of the present disclosure, the effect is achieved that it is possible to provide, in a semiconductor device having a wiring layer formed on circuit elements, a semiconductor device and a method of manufacturing a semiconductor device in which failures caused by thermal stress generation are inhibited.

BRIEF DESCRIPTION OF THE DRAWINGS

Exemplary embodiments of the present disclosure will be described in detail based on the following figures, wherein.

DETAILED DESCRIPTION

Hereinafter, exemplary embodiments of the present disclosure will be described in detail with reference to the drawings. Note that in the following description, a mode in which a semiconductor device according to the present disclosure is applied to a CSP is described. Moreover, because the structure of the rewiring is similar to that of the conventional technology shown in FIG. 5, where necessary, reference will be made to FIG. 5 and a detailed description thereof will be omitted.

Figure 1:
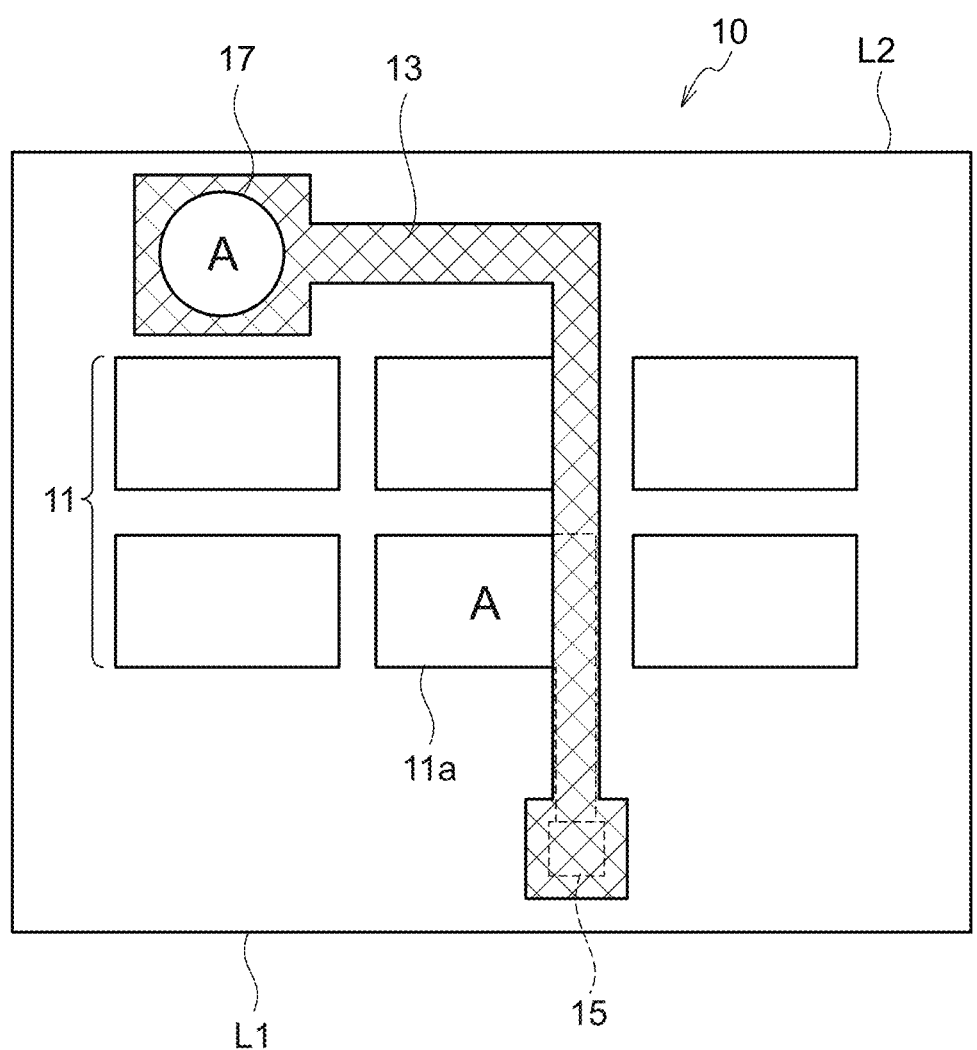
FIG. 1 is a rear surface plan view showing an example of a structure of a semiconductor device according to an exemplary embodiment.

FIG. 1 shows a plan view of a rear surface of a semiconductor device 10 which is serving as a CSP. As is shown in FIG. 1, the semiconductor device 10 is formed so as to include a circuit element area 11, a pad 15, a terminal 17, and wiring 13 that connects the pad 15 and terminal 17 together. Note that, in FIG. 1, gaps 18 (described below, e.g. see FIGS. 2A and 2B) have been omitted from the drawings.

The circuit element area 11 is an area where active devices such as transistors, diodes and the like, and passive devices such as resistors, condensers and the like, that are intended to achieve the functions desired of the semiconductor device 10 are mounted.

The pad 15 is formed by a conductive body, and is a connection area that is used for connecting to the device exterior. The pad 15 is connected to the circuit element area 11 via wiring (not shown in the drawings) that is also formed by a conductive body. The wiring 13 is what is known as 'rewiring' and is also formed by a conductive body, and is connected to the terminal 17 that is used for connecting the pad 15 to the device exterior (not shown in the drawings). In the example shown in FIG. 1, a circuit element area 11a, which is indicated in the example shown in FIG. 1 by the symbol A, is connected to the pad 15 via wiring (not shown in the drawings), and this connection extends via the wiring 13 to the terminal 17 indicated by the symbol A. The circuit element area 11a is thus connected to the device exterior via the terminal 17. Here, the fact that the wiring 13 is able to be placed on an upper portion of the circuit element area 11 is one feature of the semiconductor device 10 according to the present exemplary embodiment, and a detailed description thereof is provided below.

The terminal 17 according to the present exemplary embodiment is formed, as an example, as a post-shaped body having a substantially circular cross-section. In some cases, a solder bump (not shown in the drawing), which is a welding component used when the semiconductor device 10 is mounted on a printed circuit board or the like, is also provided on an upper surface of the terminal 17. In other words, there may be two modes of the semiconductor device 10 according to the present exemplary embodiment, namely, a mode in which a solder bump is formed on the upper surface of the terminal 17, and a mode in which no solder bump is formed thereon.

Figure 5:
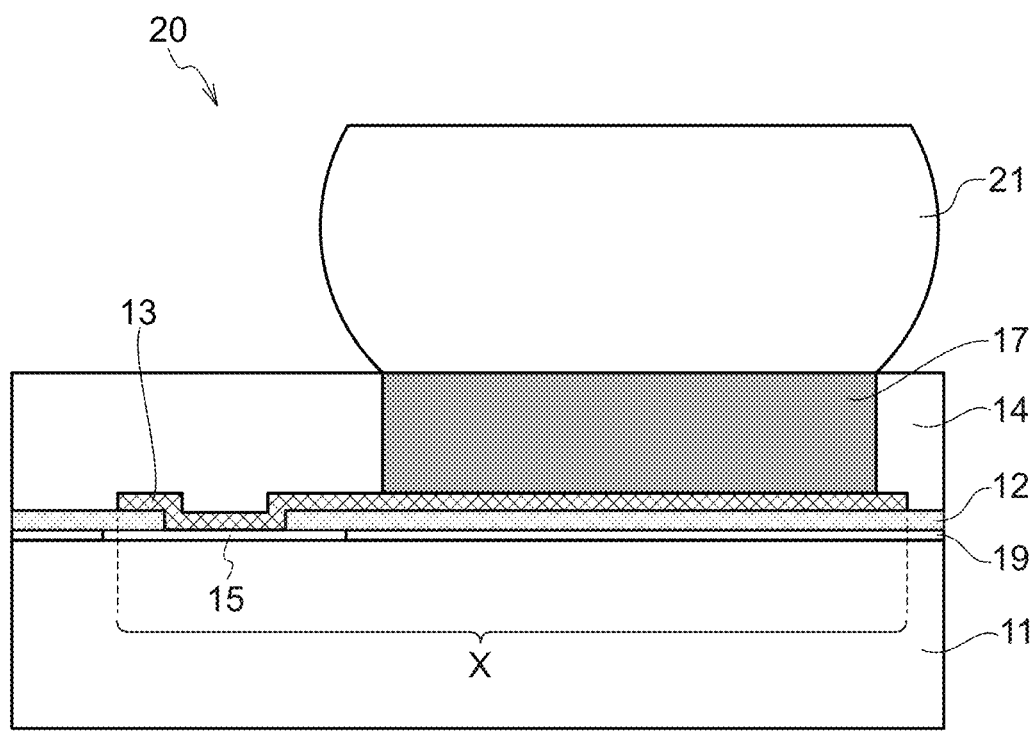
FIG. 5 is a cross-sectional view showing a structure of a post-shaped body of a semiconductor device according to the conventional technology, and of a periphery of this post-shaped body.

Here, a pad (corresponding to the pad 15) on a front surface of the semiconductor circuit of a wafer that has completed processing work is open via an aperture portion in a passivation layer (corresponding to the passivation film 19 shown in FIG. 5). In a normal package, bare chips obtained by dicing a wafer are connected by means of bonding or the like to a mounting surface of a printed circuit board or the like. In contrast, in a CSP, connection structures are built on top of the chip before dicing is performed. In the present exemplary embodiment, 'connection structures' refers to structures that are connected from the pad to the terminal by means of the rewiring. In these connection structures, a rewiring layer (corresponding to the wiring 13) is formed by a conductive body on the pad on the semiconductor circuit surface, and a surface thereof is sealed by a sealing resin while a connecting portion (corresponding to the terminal 17) on top of the rewiring layer is left unsealed. If necessary, a semispherical solder bump or the like may also be formed on the connecting portion.

Here, as has been described above, in the case of a CSP, thermal stress is generated in a laminated structure that forms a connection structure which includes a column-shaped terminal, in particular, and this thermal stress causes damage to circuit elements within the circuit element area 11. In some cases, this causes the characteristics of the circuit element area 11 to change. For this reason, in the present exemplary embodiment, gaps (i.e., air gaps) that extend as far as the circuit surface are provided in the rewiring on the circuit surface where the circuit element area 11 of the semiconductor device 10 is formed. These gaps penetrate the insulating film formed in a lower portion of the rewiring. With this configuration, the stress generated in a laminated structure that forms a connection structure is dispersed. As a result, according to the semiconductor device 10 according to the present exemplary embodiment, in a semiconductor device having a wiring layer formed on top of circuit elements, it is possible to provide a semiconductor device in which failures caused by thermal stress generation are inhibited, as well as a method of manufacturing a semiconductor device.

Figure 2A:
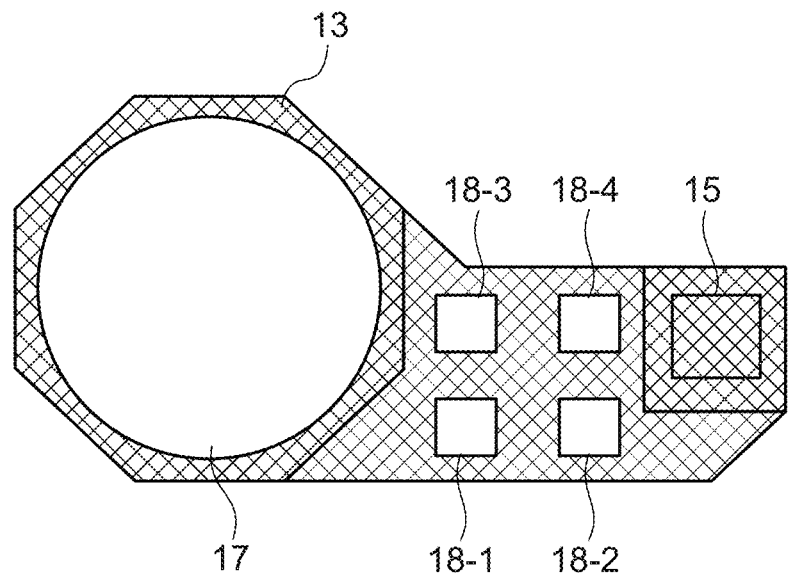
FIG. 2A is a plan view showing a connection structure of the semiconductor device according to the exemplary embodiment.
Figure 2B:
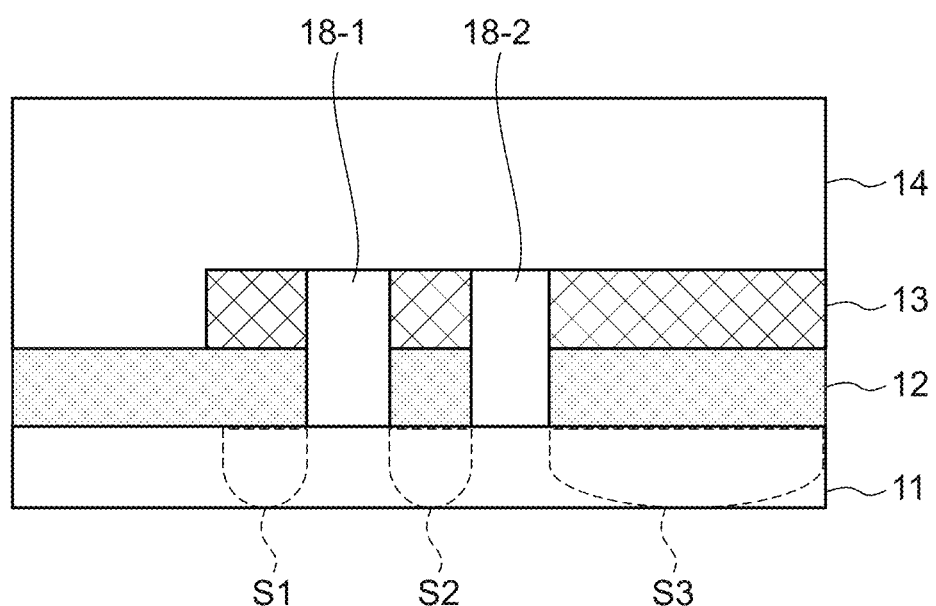
FIG. 2B is a cross-sectional view showing the connection structure of the semiconductor device according to the exemplary embodiment.

The connection structure in the semiconductor device 10 according to the present exemplary embodiment will now be described with reference to FIG. 2A and FIG. 2B. FIG. 2A shows a plan view of the connection structure of the semiconductor device 10, and shows the pad 15 and terminal 17 connected together via the wiring 13. However, in FIG. 2A, the mold resin 14 has been omitted from the drawing. As is shown in FIG. 2A, in the semiconductor device 10, gaps 18-1, 18-2, 18-3, and 18-4 (hereinafter, these are referred to collectively as 'gaps 18') are provided in a portion of the area where the wiring 13 is formed. FIG. 2B shows a cross-section of the gaps 18. As is shown in FIG. 2B, the gaps 18 are provided extending from the upper surface of the wiring 13 to the lower portion of the insulating film 12, and so as to penetrate both the wiring 13 and the insulating film 12. The interior of each of the gaps 18 according to the present exemplary embodiment is filled with air. In other words, it is preferable that the interior of each of the gaps 18 not be filled with a solid substance. In contrast, because there are no preferences as to which type of gas is used, it is also possible, for example, for nitrogen or the like to be sealed in the gaps 18.

Symbols 'S1', 'S2', and 'S3' shown in FIG. 2B show stress application areas where there is a possibility of thermal stress generated in the laminated structure forming the connection structure being applied. As is shown in FIG. 2B, because the presence of the gaps 18 enable these areas where stress application occurs uniformly to be dispersed over almost the entire area of the laminated structure forming the connections structure according to the conventional technology, according to the semiconductor device 10 according to the present exemplary embodiment, it is possible to alleviate the effects of stress on the circuit element area 11.

Figure 3A:
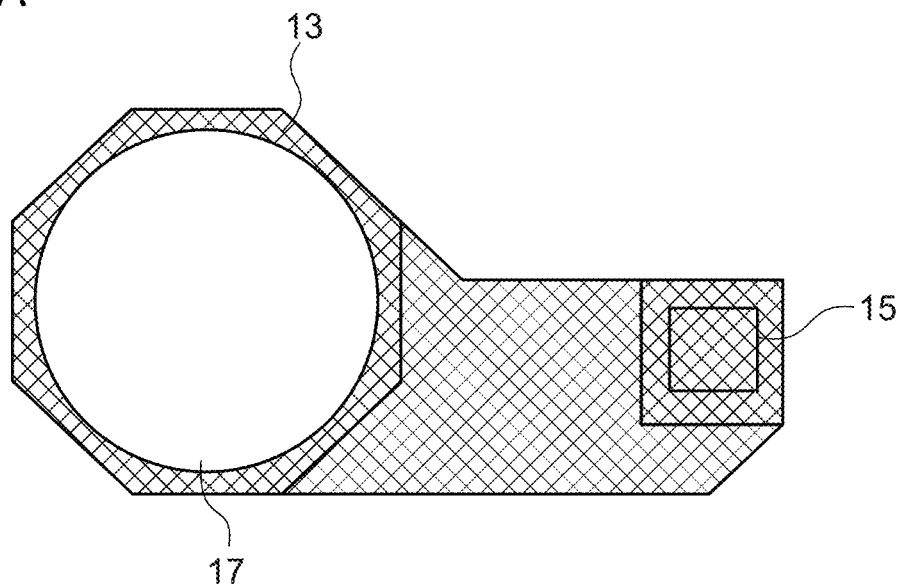
FIG. 3A is a plan view showing a connection structure of a semiconductor device according to a comparative example.
Figure 3B:
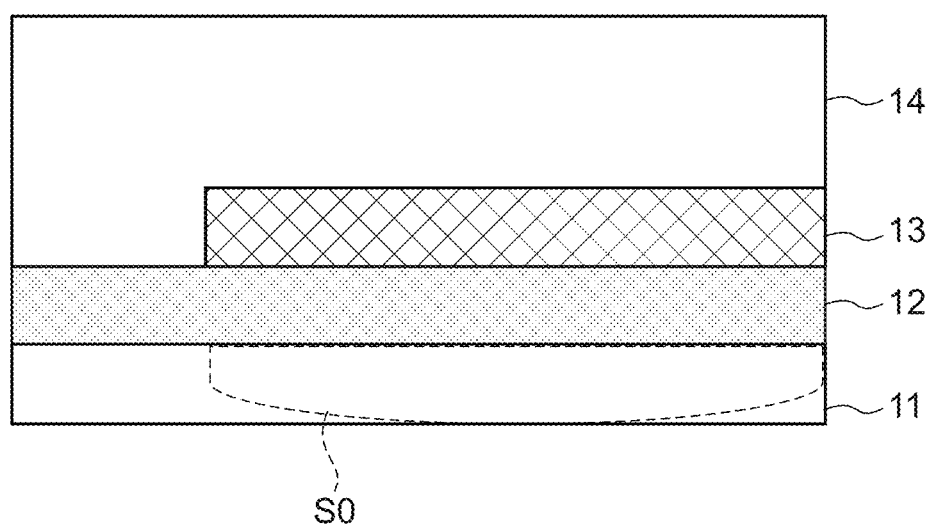
FIG. 3B is a cross-sectional view showing the connection structure of the semiconductor device according to the comparative example.

FIG. 3A and FIG. 3B show a connection structure according to a comparative example. FIG. 3A is a plan view of this connection structure, while FIG. 3B is a cross-sectional view thereof. FIG. 3A shows a structure in which the gaps 18 have been removed from the connection structure according to the present exemplary embodiment which is shown in FIG. 2A. As is shown in FIG. 3B, because the connection structure according to the comparative example is not provided with the gaps 18, the stress application area SO occupies the entire lower portion of the wiring 13. Accordingly, compared with the connection structure according to the present exemplary embodiment, the effects of thermal stress on the circuit element area 11 are greater.

Here, the fact that, as is shown in FIG. 1, the wiring 13 is able to be disposed on an upper portion of the circuit element area 11 is an example of a feature of the semiconductor device 10 according to the present exemplary embodiment. Although not shown in FIG. 1, gaps are formed in a portion of the area of the wiring 13 shown in FIG. 1. Accordingly, because thermal stress is alleviated in the laminated structure forming the connection structure, it is possible for the wiring 13 to be disposed in an upper portion of the circuit element area 11 (i.e., spanning the circuit element area 11). In the semiconductor device 10, because the wiring 13 is able to be formed in this way, compared with the semiconductor device according to the comparative example, there is an increased degree of freedom when designing the wiring layout.

Here, the pad 15 is disposed in an area where, normally, circuit elements are not formed around the periphery of the semiconductor device 10. For example, in the case of the example shown in FIG. 1, the pad 15 that is connected to the circuit element area 11a is disposed in an area extending along a side of the semiconductor device 10. Here, for reasons of convenience regarding the pin placement of the CSP, there may be cases in which a user wishes to locate the terminal 17 in an area which extends along a side L2. In this type of situation as well, in the semiconductor device 10, as is shown in FIG. 1, it is possible to connect the wiring 13 to the pad 15 that is disposed in a position along the side L1 and extend the wiring 13 so that it spans right across the circuit element area 11, and then connect the wiring 13 to the terminal 17 which is disposed in a position along the side L2. In this way, according to the semiconductor device 10 according to the present exemplary embodiment, the degree of freedom of the wiring is markedly improved compared with a semiconductor device according to the comparative example.

Figure 4:
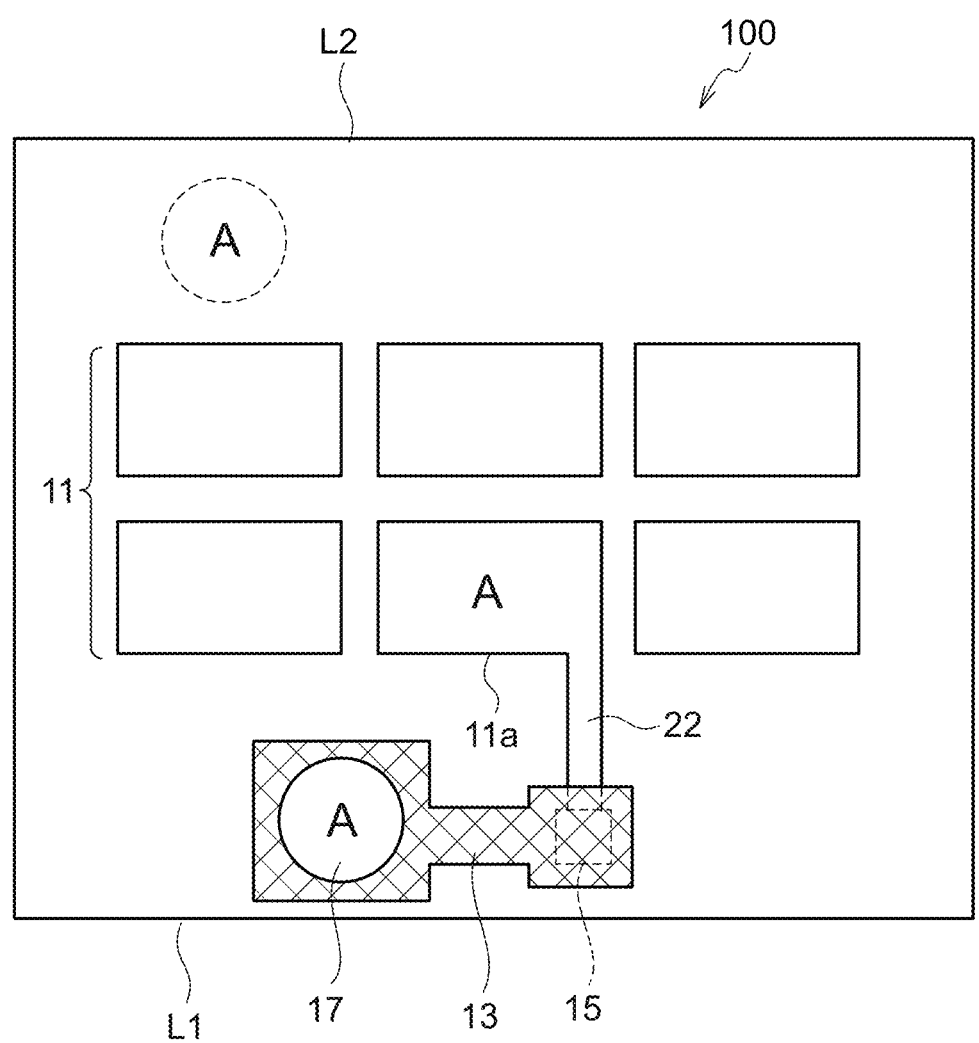
FIG. 4 is a plan view of the semiconductor device according to the comparative example.

FIG. 4 shows a plan view of a rear surface of a semiconductor device 100 according to a comparative example. In the plan view shown in FIG. 4, the circuit element area 11 and the pad 15 are disposed in the same positions as in the semiconductor device 10 shown in FIG. 1. The pad 15 is connected to the circuit element area 11a via wiring 22. Here, because the gaps 18 are not provided in the semiconductor device 100, it is not possible for the wiring 13 to be provided so as to span across the circuit element area 11. Because of this, the terminal 17 cannot be located in the area along the side L2 (i.e., the portion shown by a dotted line circle in FIG. 4), and there is no alternative but to locate the terminal 17 in the area along the side L1. In this case, there are considerable limitations on the pin placement of the semiconductor device 100, and there is no alternative but to try and obtain a desired placement using, for example, the pattern or the like of the printed circuit board on which the semiconductor device 100 is mounted.

Note that in FIG. 2A, a mode in which four gaps 18 are provided in the area of the wiring 13 is described as an example, however, the number of gaps 18 is not particularly restricted. However, because the resistance of the wiring 13 increases as the number of gaps 18 increases, the number of gaps 18 may be set while taking the effects thereof on the electrical characteristics of the semiconductor device 10 (i.e., the effects thereof on the amplitude and the like of signals transmitted through the terminal 17) into consideration. In other words, it is more preferable that as many rectangular parallelepiped shaped gaps 18 as possible be provided within a range whereby they do not affect the electrical characteristics. At this time, the gaps 18 may be arranged in an array layout, or in a staggered layout.

When the shape of the gaps 18 when looked at in plan view is a square shape, then it is preferable that the gaps 18 are sized so that a length of one side thereof is not more than 10 μm, while if the shape of the gaps 18 when looked at in plan view is a circular shape, then it is preferable that the gaps 18 are sized so that a diameter thereof is not more than 10 μm. By setting the size of the gaps 18 to approximately these dimensions, the mold resin 14 is inhibited from filling the interior of each gap 18 during the semiconductor device 10 manufacturing process, so that these dimensions are preferable. On the other hand, a lower limit for the size of the gaps 18 may be set while taking into consideration the efficient dispersion of thermal stress and limitations on the manufacturing process and the like, however, the above-described length of one side or diameter may be set, for example, to not less than 5 μm.

A width of the wiring 13 having the gaps 18 that is formed in the semiconductor device 10 will now be described. Although the wiring width varies depending on what application the semiconductor device 10 is to be used for, particularly in cases in which thermal stress is a problem (for example, in the case of a semiconductor device in a power supply system), the width of the wiring 13 may be set, for example, to approximately the same width as that of the base of the terminal 17. As an example, in a case in which the diameter of the terminal 17 is approximately 200 µm, then because the diameter of the base is approximately 220 µm, a wiring width excluding the gaps 18 is set such that a diameter of approximately 220 µm can be secured. On the other hand, because the wiring width is at the minimum, for example, in the connecting portion between the wiring 13 and the pad 15, as an example, it is necessary for the minimum value of the wiring width excluding the gaps 18a to be set at a width of approximately 40 µm. In addition, an interval between mutually adjacent gaps 18 (in other words, the density of the gaps 18) varies depending on what application the semiconductor device 10 is to be used for, however, this interval may be set using simulations or the like so as to enable an optimum wiring area to be secured relative to the drive voltage transmitted through the terminal 17.

Next, a method of manufacturing the semiconductor device 10 according to the present exemplary embodiment will be described. Note that in the following description, a stage at which the formation of the pad 15 and the passivation film 19 on the circuit surface of a semiconductor substrate (not shown in the drawings) has already been completed, in other words, a stage at which the processing work on a wafer has already been completed, but prior to the rewiring processing being performed is described.

Firstly, the insulating film 12 (i.e., a lower layer insulating film) is formed. In other words, for example, a thermosetting material that will ultimately form the insulating film is formed on the circuit surface, and is then patterned via photolithography. Next, thermosetting of this material is performed. In the patterning step according to this processing, patterning to form gaps in the passivation film 19 and in the insulating film 12 is also performed.

Next, the wiring 13, which is rewiring, is formed in an upper portion of the insulating film 12. In other words, a conductor that will ultimately form a seed layer is formed on the circuit surface (not shown in the drawings), and is then patterned via photolithography. Next, resist is coated onto the circuit surface, and a mask is formed. Plating is then performed using Cu so as to form the wiring 13. Subsequently, the resist that has been used is removed. In the patterning step according to this processing, patterning to form gaps in the wiring 13 is also performed.

Next, the terminal 17 is formed. In other words, Cu plating is performed via photolithography so that the terminal 17 is formed on top of the wiring 13. Thereafter, the resist used for the mask is removed.

Next, the mold resin 14 is formed. In other words, for example, thermosetting resin that will ultimately form the mold resin 14 is formed on the circuit surface, and thermosetting of this resin is performed.

Next, the solder bump 21 is formed. In other words, solder is printed onto the circuit surface and reflow is performed. Note that in a semiconductor device 10 of a type that does not use the solder bump 12, but leaves the terminal 17 directly open, this processing step may be omitted.

Here, the difference between a method of manufacturing a semiconductor device according to the conventional technology, and the method of manufacturing the semiconductor device 10 according to the present exemplary embodiment is that, in the method of manufacturing the semiconductor device 10 according to the present exemplary embodiment, the gaps 18 are formed at the same time as the processing to form the lower layer insulating film (i.e., the insulating film 12) and the rewiring (i.e., the wiring 13) is performed. As a consequence of this, it is possible to form the gaps 18 without having to increase the number of processing steps of the method of manufacturing a semiconductor device according to the conventional technology.

Note that in the above-described exemplary embodiments, an example is described of modes in which the shape of the gaps 18 when looked at in plan view is either a square shape or a circular shape, however, taking into consideration the efficient dispersion of thermal stress and the like, it is possible to employ another suitable shape such as an oblong shape or an elliptical shape.

Exemplary embodiments of the present disclosure have been described above, however, the present disclosure is not limited to this. Various modifications and the like may be made to the present disclosure insofar as they do not depart from the spirit or scope of the present disclosure.

What is claimed is:

1. A semiconductor device comprising:
   wiring that is formed by a conductive body extending, via an insulating film, on a front surface of a semiconductor substrate; and
   an insulating layer that covers the front surface of the semiconductor substrate including the wiring,
   wherein gaps are provided from an upper surface of the wiring to a lower portion of the insulating film to penetrate through both the wiring and the insulating film.

2. The semiconductor device according to claim 1, wherein:
   circuit elements are formed on a front surface side of the semiconductor substrate.

3. The semiconductor device according to claim 2, wherein:
   the gaps are provided at an upper portion of the circuit elements.

4. The semiconductor device according to claim 1, further comprising:
   an aperture portion that is formed at the insulating layer on top of the wiring; and
   a post-shaped terminal that is formed at the aperture portion and is connected to the wiring,
   wherein the gaps are not provided underneath the post-shaped terminal.

5. The semiconductor device according to claim 2, further comprising:
   an aperture portion that is formed at the insulating layer on top of the wiring; and
   a post-shaped terminal that is formed at the aperture portion and is connected to the wiring,
   wherein the gaps are not provided underneath the post-shaped terminal.

6. The semiconductor device according to claim 3, further comprising:
   an aperture portion that is formed at the insulating layer on top of the wiring; and
   a post-shaped terminal that is formed at the aperture portion and is connected to the wiring,
   wherein the gaps are not provided underneath the post-shaped terminal.

7. The semiconductor device according to claim 1, wherein a shape of the gaps is either a circular shape having a diameter of 10 micrometers or less, or a square shape having a side whose length is 10 micrometers or less.

8. The semiconductor device according to claim 2, wherein a shape of the gaps is either a circular shape having a diameter of 10 micrometers or less, or a square shape having a side whose length is 10 micrometers or less.

9. The semiconductor device according to claim 3, wherein a shape of the gaps is either a circular shape having a diameter of 10 micrometers or less, or a square shape having a side whose length is 10 micrometers or less.

10. The semiconductor device according to claim 4, wherein a shape of the gaps is either a circular shape having a diameter of 10 micrometers or less, or a square shape having a side whose length is 10 micrometers or less.

11. The semiconductor device according to claim 5, wherein a shape of the gaps is either a circular shape having a diameter of 10 micrometers or less, or a square shape having a side whose length is 10 micrometers or less.

12. The semiconductor device according to claim 6, wherein a shape of the gaps is either a circular shape having a diameter of 10 micrometers or less, or a square shape having a side whose length is 10 micrometers or less.

13. The semiconductor device according to claim 1, wherein:
a plurality of the gaps are provided in an array layout.

14. The semiconductor device according to claim 2, wherein:
a plurality of the gaps are provided in an array layout.

15. The semiconductor device according to claim 3, wherein:
a plurality of the gaps are provided in an array layout.

16. The semiconductor device according to claim 4, wherein:
a plurality of the gaps are provided in an array layout.

17. The semiconductor device according to claim 5, wherein:
a plurality of the gaps are provided in an array layout.

18. The semiconductor device according to claim 6, wherein:
a plurality of the gaps are provided in an array layout.

19. A method of manufacturing a semiconductor device comprising:
forming, on one surface of a semiconductor substrate, circuit elements that include first wiring, the circuit elements being connected by the first wiring to a pad;
forming an insulating film on an upper portion of the circuit elements, and also forming apertures at the insulating film in an area of the pad and in predetermined areas; and
forming, on an upper portion of the insulating film, second wiring that is connected to the pad, and also forming the second wiring such that apertures are formed therein at the predetermined areas.

* * * * *